United States Patent
Van Brocklin et al.

(10) Patent No.: US 6,879,525 B2
(45) Date of Patent: Apr. 12, 2005

(54) FEEDBACK WRITE METHOD FOR PROGRAMMABLE MEMORY

(75) Inventors: Andrew L. Van Brocklin, Corvallis, OR (US); Peter Fricke, Corvallis, OR (US); S. Jonathan Wang, Albany, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 463 days.

(21) Appl. No.: 10/001,680

(22) Filed: Oct. 31, 2001

(65) Prior Publication Data

US 2003/0081445 A1 May 1, 2003

(51) Int. Cl.[7] .............................. G11C 7/00; G11C 8/00
(52) U.S. Cl. ............... 365/189.09; 365/200; 365/225.7; 365/230.06
(58) Field of Search .................... 365/189.09, 200, 365/225.7, 230.06

(56) References Cited

U.S. PATENT DOCUMENTS

| | | | |
|---|---|---|---|
| 3,886,577 A | 5/1975 | Buckley | |
| 5,625,220 A | 4/1997 | Liu et al. | 257/530 |
| 5,671,180 A * | 9/1997 | Higuchi | 365/200 |
| 5,835,396 A | 11/1998 | Zhang | 365/51 |
| 5,926,415 A | 7/1999 | Shin | 365/185.17 |
| 5,963,490 A * | 10/1999 | Kawamura | 365/189.09 |
| 6,002,607 A | 12/1999 | Dvir | 365/103 |
| 6,034,882 A | 3/2000 | Johnson et al. | 365/103 |
| 6,141,241 A | 10/2000 | Boil et al. | |
| 6,185,121 B1 | 2/2001 | O'Neill | 365/94 |
| 6,185,122 B1 | 2/2001 | Johnson et al. | 365/103 |
| 6,262,926 B1 * | 7/2001 | Nakai | 365/200 |

* cited by examiner

Primary Examiner—Trong Phan
(74) Attorney, Agent, or Firm—Timothy F. Myers

(57) ABSTRACT

An integrated circuit includes an array of state-change devices, first and second decoder circuits for selecting a particular state-change device. A voltage source is coupled to the first decoder circuit and sense circuitry is coupled to the second decoder to receive an electrical parameter from the selected state-change device and to detect a particular value of the electrical parameter. A control circuit is coupled to the voltage source, the first and second decoders, and the sense circuitry to select a first voltage from the voltage source to alter the selected state-change device and to select a second voltage from the voltage source when the sense circuitry detects the particular value of the electrical parameter.

33 Claims, 8 Drawing Sheets

FEEDBACK WRITE METHOD FOR PROGRAMMABLE MEMORY

BACKGROUND OF THE INVENTION

As computer and other electrical equipment prices continue to drop in price, the manufacturers of storage devices, such as memory and hard drives, are forced to lower the cost of their components. At the same time, the computer, game, television and other electrical device markets are requiring larger amounts of memory to store images, pictures, movies, music, and other data intensive files. Thus, besides reducing cost, manufactures of storage devices must also increase the storage density of their devices. This trend of increasing memory storage while at the same time reducing the cost required to create the storage has been continuous for over 20 years and will continue into the future. However, most conventional memory technologies such as magnetic disk storage, dynamic random-access memory, and even optical storage such as CD-ROMs, CD-R, CD-R/W and DVD variants are being challenged by physical limitations and high slot costs. To further increase storage density while also decreasing the cost of fabrication, a need exists to create new memory cell structures that can overcome the physical limitations imposed with conventional technology.

SUMMARY OF THE INVENTION

An integrated circuit includes an array of state-change devices, first and second decoder circuits for selecting a particular state-change device. A voltage source is coupled to the first decoder circuit and sense circuitry is coupled to the second decoder to receive an electrical parameter from the selected state-change device and to detect a particular value of the electrical parameter. A control circuit is coupled to the voltage source, the first and second decoders, and the sense circuitry to select a first voltage from the voltage source to alter the selected state-change device and to select a second voltage from the voltage source when the sense circuitry detects the particular value of the electrical parameter.

BRIEF DESCRIPTION OF THE DRAWINGS

The invention is better understood with reference to the following drawings. The elements of the drawings are not necessarily to scale relative to each other. Rather, emphasis has instead been placed upon clearly illustrating the invention. Furthermore, like reference numerals designate corresponding similar parts through the several views.

DETAILED DESCRIPTION OF THE PREFERRED EMBODIMENT

Figure 1:
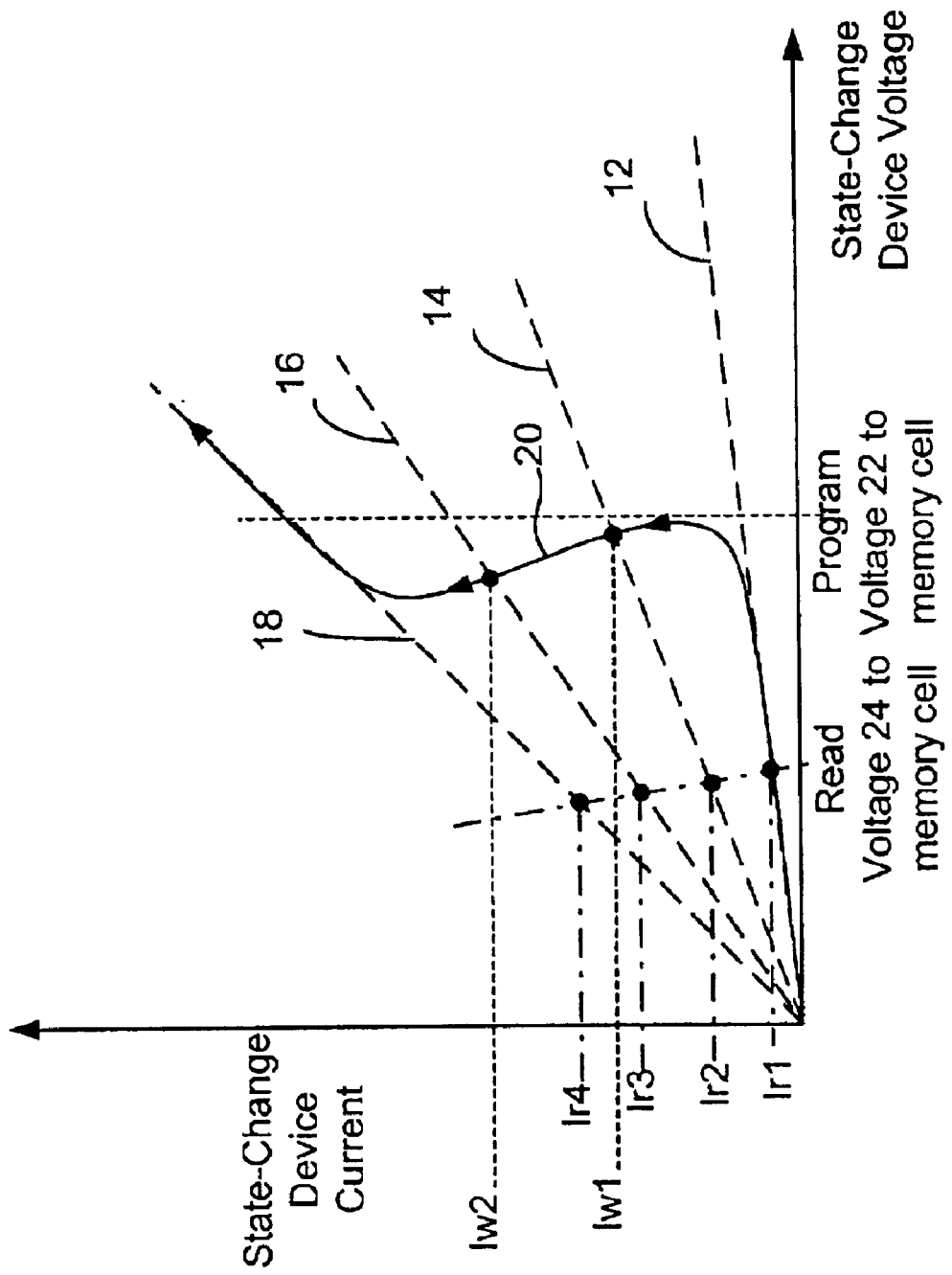
FIG. 1 is an exemplary chart of voltage vs. current for a state-change device in a memory cell.

The semiconductor devices of the present invention are applicable to a broad range of semiconductor devices technologies and can be fabricated from a variety of semiconductor materials. The following description discusses several presently preferred embodiments of the semiconductor devices of the present invention as implemented in silicon substrates, since the majority of currently available semiconductor devices are fabricated in silicon substrates and the most commonly encountered applications of the present invention will involve silicon substrates. Nevertheless, the present invention may also advantageously be employed in gallium arsenide, germanium, and other semiconductor materials. Accordingly, the present invention is not intended to be limited to those devices fabricated in silicon semiconductor materials, but will include those devices fabricated in one or more of the available semiconductor materials and technologies available to those skilled in the art, such as thin-film-transistor (TFT) technology using polysilicon on glass substrates or organic semiconductors on plastic or cellulose films.

It should be noted that the drawings are not true to scale. Further, various parts of the active elements have not been drawn to scale. Certain dimensions have been exaggerated in relation to other dimensions in order to provide a clearer illustration and understanding of the present invention.

In addition, although the embodiments illustrated herein are shown in twodimensional views with various regions having depth and width, it should be clearly understood that these regions are illustrations of only a portion of a device that is actually a three-dimensional structure. Accordingly, these regions will have three dimensions, including length, width, and depth, when fabricated on an actual device. Moreover, while the present invention is illustrated by preferred embodiments directed to active devices, it is not intended that these illustrations be a limitation on the scope or applicability of the present invention. It is not intended that the active devices of the present invention be limited to the physical structures illustrated. These structures are included to demonstrate the utility and application of the present invention to presently preferred embodiments.

The embodiments of the invention utilize a feedback write method to alter a state-changeable memory cell such as a one-time programmable anti-fuse device, a phase-change device that is read-writeable, or programmable switches such as Lecomber or silicide switches. One aspect of the invention is to allow for storage of more than one bit of information within a memory cell. By storing more than one bit of information within a memory cell, the amount of circuitry required on an integrated circuit (IC) is substantially reduced, allowing for reduced cost and smaller die sizes.

The feedback method takes advantage of the current/voltage curves of programmable memory cells that have a continuous change of state between an unprogrammed state and a programmed state. By using feedback of electrical parameters of the state-change devices in the memory cells, the programming process can be interrupted before the conventional maximum or fully programmed state is reached. The invention allows for controlled and process independent programming of multiple states per state-change element in the memory cells.

The feedback method can be either continuous or discretely implemented. Preferably a memory array is made up of an organization of separate memory cells that are arranged in rows and columns although there may be multiple stacks of rows and columns to form a three-dimensional memory array. Preferably, each memory cell is made up of a control element, such as a diode or resistor, and a state-change device such as a tunneling anti-fuse, a phase-change device, Lecomber switch, or silicide switch. Optionally, more than one state-change element may be present per memory cell and optionally, the control element may be shared among one or more memory cells.

Preferably the state-change device is a direct tunneling anti-fuse structure that is formed with a thin oxide layer over a conductive layer and directly coupled to a PiN diode formed by an amorphous or crystalline doping process. The state-change element preferably utilizes electron tunneling. Most preferably, the electron tunneling is direct tunneling thereby requiring that the oxide layer thickness be minimal, such as about 5 to about 50 Angstroms. Such a state-change element creates an anti-fuse structure with preferable current/voltage characteristics. At a low voltage potential across the oxide layer, such as during reading of the memory cell, the current is in the low microampere or high nano-ampere range and is thus efficient for power. When the anti-fuse is programmed by creating filaments through the oxide, the current is in the high microampere or low milli-amp range. This change in current levels creates a very good signal to noise ratio for sensing whether the oxide is programmed as a logical 0 or 1 state or even more intermediate levels of states. At higher voltage potentials, such as during programming, the oxide layer begins to have higher current flows due to the tunneling current. This tunneling current creates a flow of electrons that locally heats the state-change element, the oxide, and forms the conductive filaments through the oxide. When sufficient energy is forced across the oxide barrier to sufficiently heat the fusing site, a conducting filament is formed through the oxide and the state of the oxide is changed permanently for a one-time programmable structure.

Alternative state-change technologies can be used. For example, the state-change element can be either a read only LeComber or silicide switch, or a read/writeable phase-change material. One method of forming a LeComber switch is to deposit a thin layer of amorphous intrinsic silicon on a first conductor, preferably a layer of metal such as Chromium (Cr). Then a separate metal, such as gold (Ag) is deposited on the amorphous intrinsic silicon. Before programming, the LeComber switch acts as a reversed biased Schottky diode. Creating an enhanced concentrated electric field through the amorphous silicon with the invention will cause a conductive path to form or allow for hopping conduction, thus creating the anti-fuse.

One preferable phase-change material for a read/writeable state-change element is germanium telluride (GeTe), which can be reversibly changed from a semiconducting (amorphous) to a metallic (crystalline) state by heating and cooling it at a proper rate. For example, if the GeTe is doped so that it is p-type when in its semiconducting state and is deposited on top of an n-type semiconductor-layer, then a large contrast will be seen in the number of carriers swept across the junction if the GeTe is changed to its metallic state. By using GeTe or equivalent phase-change material, the memory cell is capable of being read-writeable, e.g. being capable of writing and erasing many times. This function increases the utility of the memory cell structure for some applications. Other phase-change materials can be substituted for GeTe and still meet the spirit and scope of the invention. Some examples of other preferable phase-change materials are chalcogenide alloys such as: GaSb, InSb, InSe, $Sb_2Te_3$, $Ge_2Sb_2Te_5$, InSbTe, GaSeTe, $SnSb_2Te_4$, InSbGe, AgInSbTe, (GeSn)SbTe, GeSb(SeTe), $Te_{81}Ge_{15}Sb_2S_2$ and GeSbTe.

Other antifuse structures are silicide switches. Silicide switches are formed with alternatively stacked silicon and transition metal thin films that change resistance when programmed. Generally, the programming process for a silicide fuse is irreversible. Before writing, the stack of transaction metal and silicon layers has a first resistance. Appropriate row and column lines are selected to force a current through a selected memory cell. The current passing through the selected memory cell creates Joule heat that triggers and completes the silicidation reaction. The silicidation reaction causes the resistance of the selected memory cell to change to a much lower value. To read the programmed memory cell, a small sense current is supplied to a selected memory cell and the voltage drop across the selected memory cell is sensed. Some preferable silicide compounds are $Ni_2Si$, NiSi, $NiSi_2$, $Pd_2Si$, PdSi, and $Pt_2Si$, and PtSi. Other possible transition metals in various compounds with silicon include Ti, V, Cr, Mn, Fe, Co, Zr, Nb, Mo, Rh, Hf, Ta, W, and Ir.

FIG. 1 is an exemplary chart illustrating the programming of a memory cell for at least one embodiment of the invention that includes a control element and a state-change element in series. The state-change element in the memory cell has a first state that is defined as the non-programmed state 12 of the state-change device before the programming process modifies it. This non-programmed state 12 is shown in FIG. 1 as the relationship between the state-change device voltage and current electrical parameters, i.e. resistance or conductance. The programming path 20 illustrates the current/voltage relationship of a state-change device in an exemplary memory cell wherein the control element has a defined resistance. As the program voltage 22 is applied to the memory cell, a portion of the program voltage drops across the control element and a portion drops across the state-change element depending on their respective resistances. Typically, a state-change device will have a very high resistance with respect to the control element when the state-change device is in its non-programmed state. Thus, as the voltage on the memory cell is increased from a read voltage 24 to the program voltage 22, the bulk of the voltage drops across the state-change device. When the voltage across the state-change device reaches the program voltage 22, the state-change device's resistance begins to change due to either tunneling electron conduction or diffusion of metals such as with tunneling anti-fuse, Lacomber or silicide switches, or crystallization in phase-change materials. As the memory cell voltage is held at the program voltage 22, the resistance of the state-change device decreases causing less voltage to drop across it. After the programming of the state-change device progresses, the change in resistance tapers to a fixed value and the state-change device is considered in a fully programmed state 18. One aspect of the invention is to allow for stopping the programming process before the state-change device completes its transition to the fully programmed state 18, such as first partial programmed state 14 and second partial programmed state 16. The non-programmed state 12, the first partial programmed state 14, the second partial programmed state 16 and the fully programmed state 18 are shown in FIG. 1 as dashed lines representing an ideal fixed resistance which is linearly related to the state-change device voltage and current. In actual practice, the relationship between the voltage and current may not be directly linear but could be somewhat curvilinear depending on different secondary effects such as tunneling electron conduction, work functions of conductors used, etc. However, the representation of the state-change device voltage and current is for all practical purposes adequately represented by an ideal resistor as shown. As such, for an applied voltage, below the program voltage, to the state-change device, the current through the state-change device is directly proportional to the applied voltage. As shown in FIG. 1, the first partial programmed state 14 is detected at a current Iw1 when program voltage 22 is applied to the memory cell. After programming, applying a read voltage 24 to the memory cell and detecting a current Ir2 can detect this first partial programmed state 14. Similarly, the second partial programmed state 16 is detected at a sensed current Iw2 when program voltage 22 is applied to the memory cell and after programming detected at a sensed current Ir3 when the read voltage 24 is applied to the memory cell.

As noted, the programming path 20 illustrates the change of voltage across the state-change device with respect to the current through the state-change device during programming. The negative slope is indicative of some of the voltage applied to the memory cell falling across the control element during the time of programming. An ideal control element would have zero resistance and the programming path 20 would have an infinite slope from non-programmed state 12 to the fully programmed state 18. The non-ideal representation is shown to illustrate that the actual resistance of the control element within the memory cell should be taken into account when implementing embodiments of the invention as the sensed current would have a different predetermined value during programming of the memory cell for a given programmed state and similarly during reading. Although FIG. 1 illustrates the memory cell as having four possible states, it should be noted that any amount of states could theoretically be implemented and the amount of states actually possible is limited by the signal to noise ratio found in the sense circuitry for the memory cell.

Figure 2:
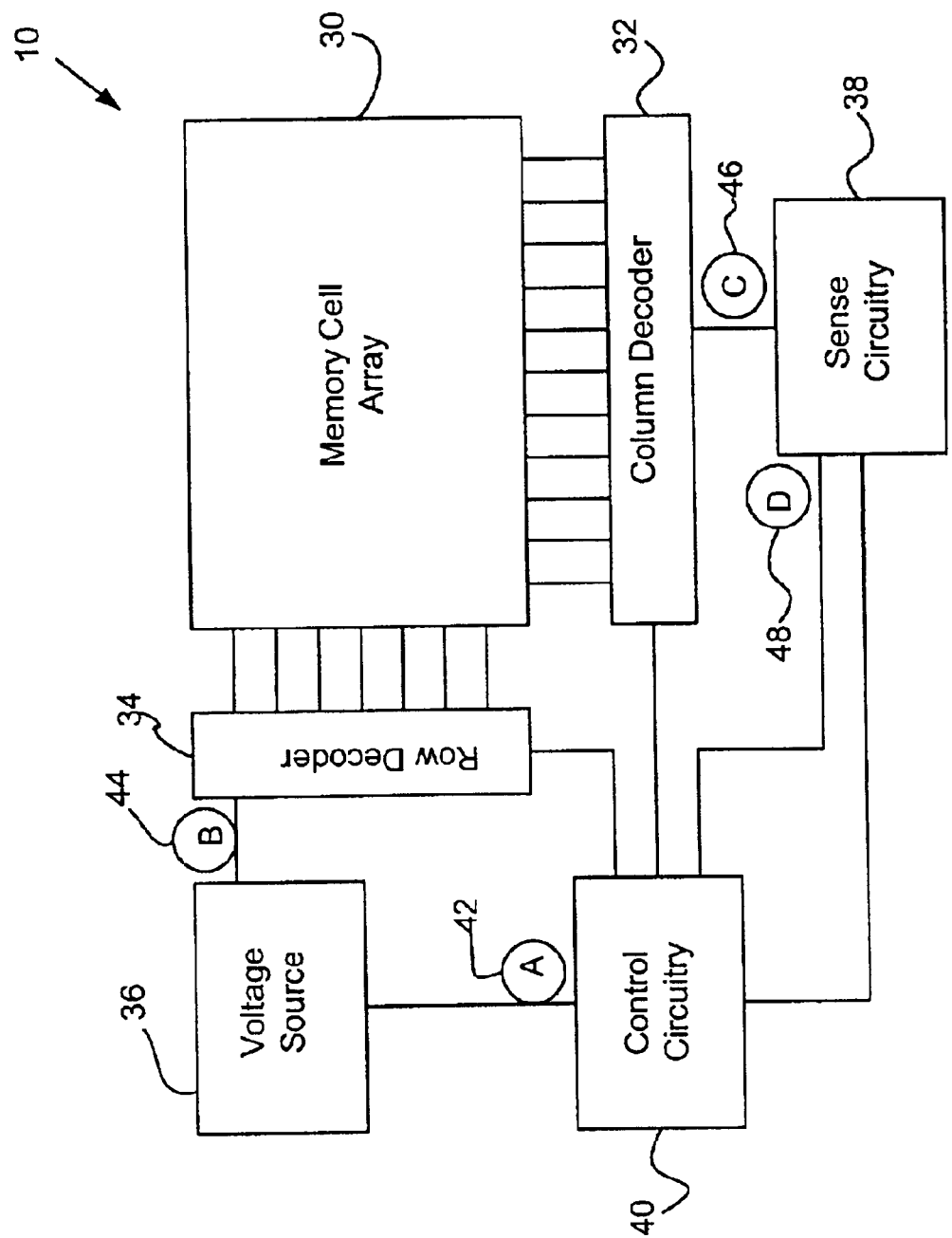
FIG. 2 is an exemplary block diagram of an embodiment of the invention in an integrated circuit.

FIG. 2 is an exemplary block diagram of an integrated circuit 10 that incorporates an embodiment of the invention. A memory cell array 30 of memory cells is preferably arranged in rows and columns, or optionally multiple layers of arrays. Each memory cell in the array 30 can be individually addressed by the use of circuitry in row decoder 34 and column decoder 32. In this embodiment, the row decoder 34 is coupled to a voltage source 36 that is used to apply a range of voltages during programming, reading and non-access of the memory cells. The voltage source 36 may have one or more outputs (shown as signal B 44). Preferably, one output would be used to provide a programming voltage and another output used to provide a read voltage. Alternatively, a programmable voltage source such as a digital to analog converter (DAC) can be used. The voltage source 36 is connected (shown as signal A 42) to control circuitry 40 that also controls the row decoder 34, column decoder 32 and sense circuitry 38. The sense circuitry 38 receives a signal (shown as signal C 46) from the column decoder 32 that detects at least one particular value of an electrical parameter of a selected memory cell from the memory cell array 30. The sense circuitry 38 sends a signal (shown as signal D 48) back to the control circuitry 40 upon detecting a predetermined value.

Preferably, each memory cell has at least one state-change device that can be programmed to multiple states. Therefore, the integrated circuit 10 has an array (2D or 3D) of state-change devices selected by a set of decoders, row decoder 34 and column decoder 32. Although FIG. 2 shows the rows as being horizontal and the columns as being vertical, those skilled in the art will appreciate that the designated nomenclature for rows and columns is arbitrary and the organization and layout of the memory array can be done in numerous fashions. When programming a selected memory cell, the control circuitry 40 directs the row decoder 34 to chose a particular row and the column decoder 32 to chose a particular column of memory cell array 30. The control circuitry 40 then directs the voltage source to supply a program voltage 22 (see FIG. 1) to the state-change device in the selected memory cell via the row decoder 34. The program voltage 22 is used to alter the state of the state-change device until the sense circuitry 38 detects a particular value of an electrical parameter (e.g. current, voltage, resistance, conductance, capacitance, inductance, impedance, etc.) from the state-change device in the selected memory cell. Preferably, the particular value to be detected is determined by the control circuitry before programming. By sensing an electrical parameter of the state-change device during programming until it meets a predetermined value, the programming process incorporates feedback in a continuous manner that ensures fast programming of the state of the state-change device.

Alternatively, a discrete time based feedback method can be used to further remove time dependent properties, such as localized heating or bit line delay, or process variations in the IC, such as resistance in the control devices. Further, a discrete time based feedback method allows for digital implementation versus complex analog circuitry. In the discrete time based feedback method, the program voltage 22 is applied to the state-change device for a first time period, then the read voltage 24 is applied to the state-change device before sensing the electrical parameter of the state-change device. By doing so, the electrical parameter sensed is determined at the same voltage level as used later to read the programmed state of the memory cell. In addition, this technique allows for possibly simpler circuitry because the same sense circuits can be used for programming and normal operation of the memory device. Alternatively, a lower voltage level than the read voltage level 24 can be applied and different sense values used during programming. This alternative approach allows for testing of the memory cell under worse case conditions to verify signal to noise levels are sufficient for normal operation. Preferably though, the same read voltage 24 is used for both sensing during programming and during normal operation reading of the IC to simplify circuitry and reduce costs.

Figure 3:
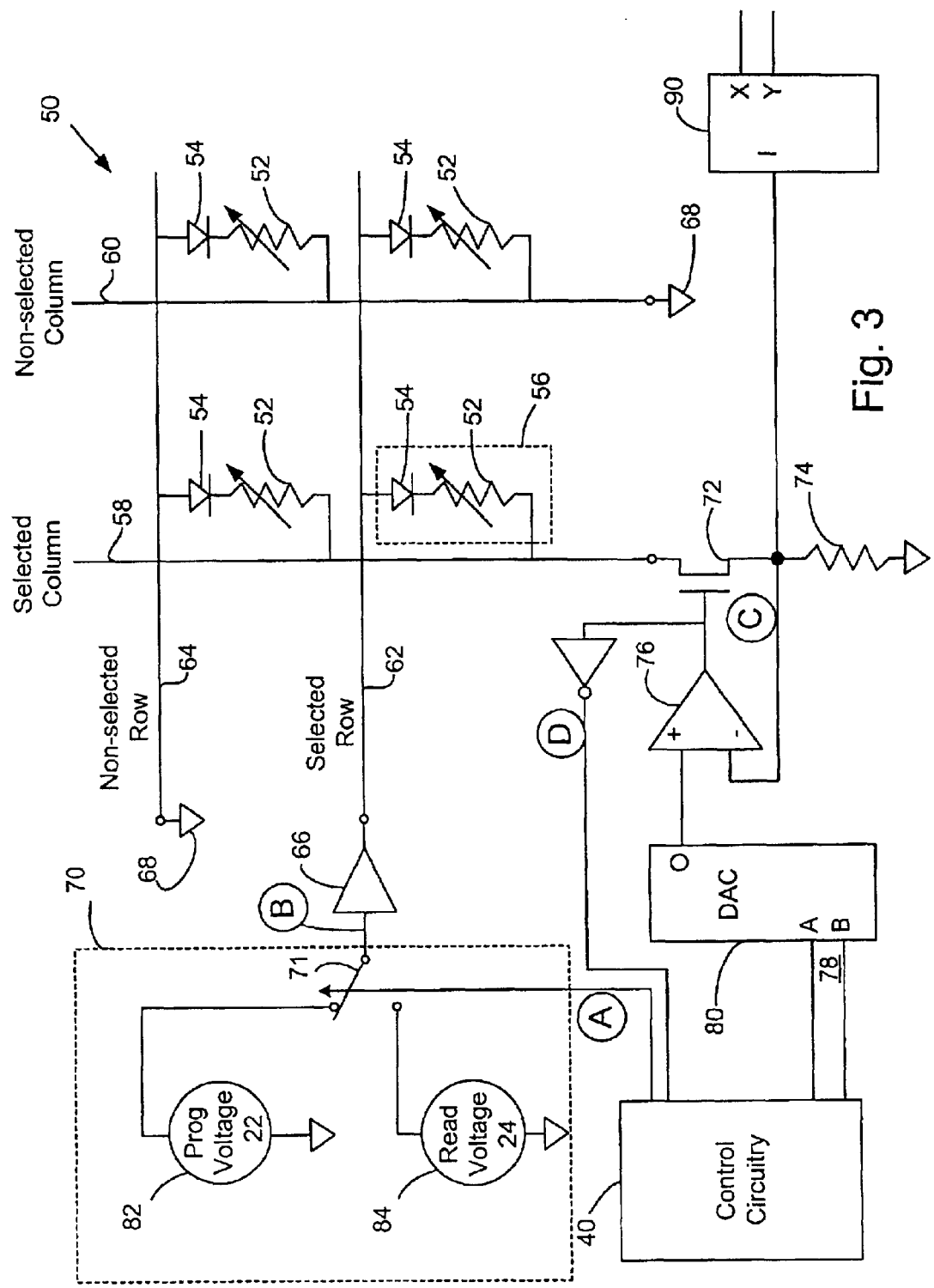
FIG. 3 is an exemplary schematic of one embodiment of the invention.

FIG. 3 is an exemplary simplified schematic of a first embodiment 50 of the invention that incorporates the continuous feedback method. A 2×2 memory array includes four memory cells 56 that include a control element 54 and a state-change device 52 connected in series. The memory cells 56 are connected to row and column lines used for selection of an individual cell. In this example, the row and column circuitry has been omitted and the non-selected row 64 and the non-selected column 60 are shown as connected to a virtual ground 68. The virtual ground 68 is preferably implemented as a grounded transistor. A voltage source 70 is connected (using Signal B) to an optional voltage buffer 66 to drive the selected row 62. Voltage source 70 has at least two voltage sources 82, 84 to create program voltage 22 and read voltage 24. The output of voltage source 70 is preferably set by control circuitry 40 using a switch 71 (using Signal A). During programming, the voltage source 70 is set to the program voltage 22 (see FIG. 1) and this voltage is applied across control element 54 and state-change device 52 of the selected memory cell 56. The control circuitry 40 is preferably connected to a digital to analog converter (DAC) 80 with digital inputs 78 (shown as inputs A and B) to select a predetermined voltage output (shown as O) that represents the desired state to be programmed into the state-change device 52. The DAC voltage output is applied to the positive input of an op-amp 76. When the N-FET 72 is off, the positive input of the op-amp 76 is higher than the negative input, the output of the op-amp 76 goes high causing an N-FET 72 to turn on to allow current to flow through sense resistor 74. Because the resistance of the state-change device is high when not programmed the current through a sense resistor 74 is low resulting in a voltage less than the output of the DAC 80. This resistor voltage is applied to the negative input of the op-amp 76. As the state-change device 52 is programmed, the current through the device will increase as its internal resistance is lowered due to the programming process. This increase in current will increase the voltage across sense resistor 74 until the negative input of the op-amp 76 is greater than the output of the DAC 80 connected to the positive input of the op-amp 76. When the negative input is greater than the positive input, the output of the opamp will go low shutting off the current flow through the state-change device 52. The output of the op-amp 76 is sent to the control circuitry 40 (using signal D) to allow it to detect the end of programming and to change the output of the voltage source to a different level such as read voltage 24 or another value such as ground.

A decoder 90 is coupled to the sense resistor 74. Preferably an analog to digital converter (DAC) is used for decoder 90 during reading of the selected memory cell to decode the programmed state of the memory cell. Optionally, the decoder 90 is implemented with a bank of fixed comparators and voltage reference sources.

Figure 4:
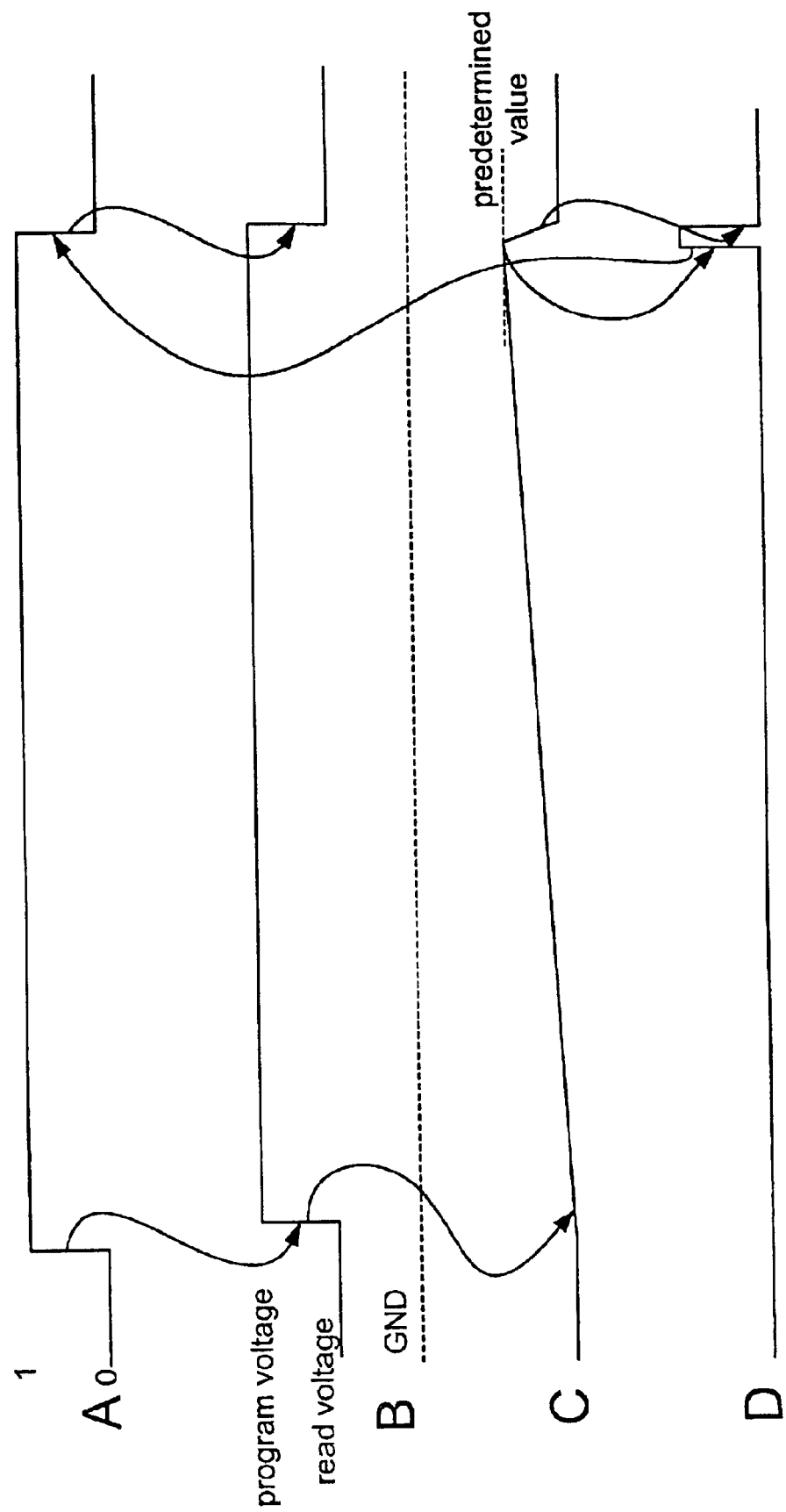
FIG. 4 is an exemplary timing diagram of signals created by the embodiment of the invention shown in FIG. 3.

FIG. 4 is an exemplary timing chart of the signals A, B, C, and D created during the programming process. Signal A is a control signal to the voltage source 70 (36 in FIG. 2). Signal B is the output of the voltage source 70. Signal C represents the current in the selected column line 58 or alternatively the voltage created across sense resistor 74 and presented to the negative input of op-amp 76. Signal D is the inverted output of the op-amp 76 that is sent to the control circuitry 40 to halt the programming process for the selected memory cell. In this embodiment, the voltage on Signal B presented to the selected memory cell before programming begins is the read voltage. When programming begins the control circuitry 40 changes Signal A from a logic zero to a logic one to enable the voltage source 70 to supply the program voltage 22 to the selected memory cell. This applied program voltage then begins to alter the state of the state-change device 52 within the selected memory cell by preferably lowering its resistance and thereby increasing the current through it over time as shown in FIG. C. Preferably, prior to beginning the programming, the control circuitry 40 sets a predetermined voltage on the positive input of op-amp 76 which in turn causes N-FET 72 to become enabled. The current through the state-change device 52 is converted to a voltage level by sense resistor 74 and is applied to the negative input of op-amp 76 as shown in Signal C. When Signal C reaches the predetermined value of voltage applied to the positive input of op-amp 76, the output of the op-amp changes as shown in Signal D. This signal disables the current through the state-change device 52 and thus stops programming while at the same time it alerts the control circuitry 40 to change the voltage applied to the selected memory cell, such as read voltage 24 or ground. When the current through the selected state-change element drops the output of the op-amp 76 again turns on the N-FET 72.

Optionally, the control circuitry 40 can change the value presented to the DAC 80 on inputs 78 and using the Signal D verify that the state-change device 52 has been programmed properly to the correct state.

Figure 5:
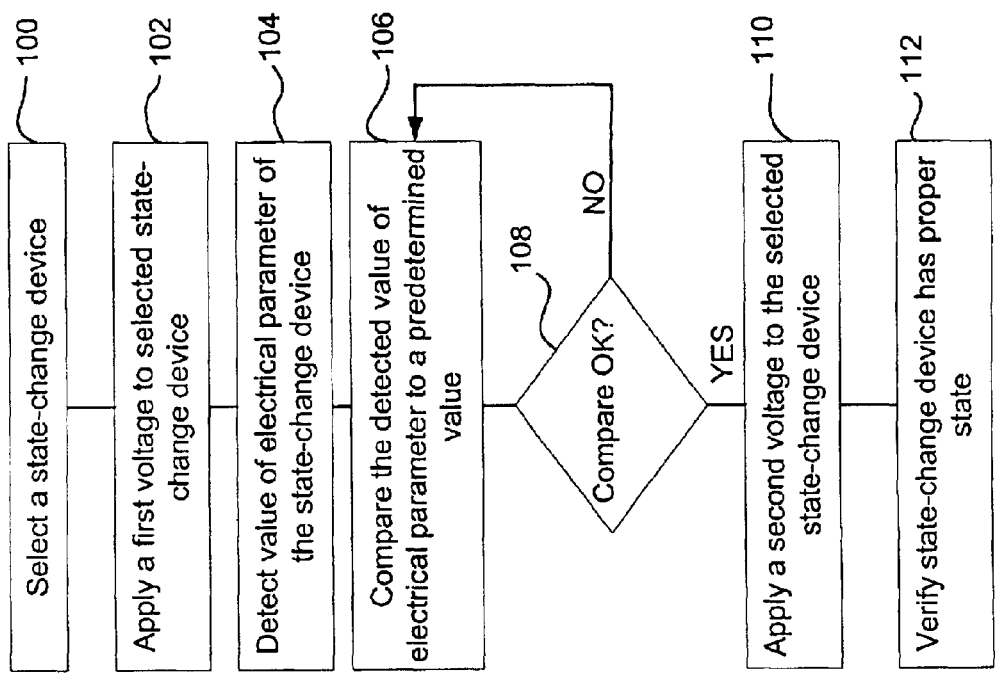
FIG. 5 is a flow chart of an exemplary process used to program a memory cell in the embodiment of the invention shown in FIG. 3.

FIG. 5 is an exemplary flow chart of the programming process used by the control circuitry used to change the state of the state-change device in the first embodiment. The control circuitry logic can be implemented in several ways. It can be fixed logic, programmable logic, a programmable processor executing control codes stored in computer executable memory, or a state machine as a few examples. The control circuitry 40 also optionally communicates with other circuitry on or outside of IC 10. In step 100, a state-change element is selected by the control circuitry using the row and column decoders. In step 102, a first voltage equal to the programming voltage is applied to the selected state-change element. In step 104, a value of an electrical parameter, such as current, voltage, resistance, conductance, capacitance, inductance, or impedance of the selected state-change device is detected. In step 106, the detected value of the electrical parameter is compared to a predetermined value assigned by the control circuitry. If the predetermined value is not reached as in step 108, then step 106 is repeated. If the predetermined value is reached, then the control circuitry applies a second voltage, preferably the read voltage to the selected state-change device as in step 110. Optionally in step 112, the control circuitry can verify that the state-change device has been property programmed by adjusting the predetermined value to another value used during reading of the device, e.g. changing from Iw1 to Ir2, Iw2 to Ir3 as shown in FIG. 1.

Figure 6:
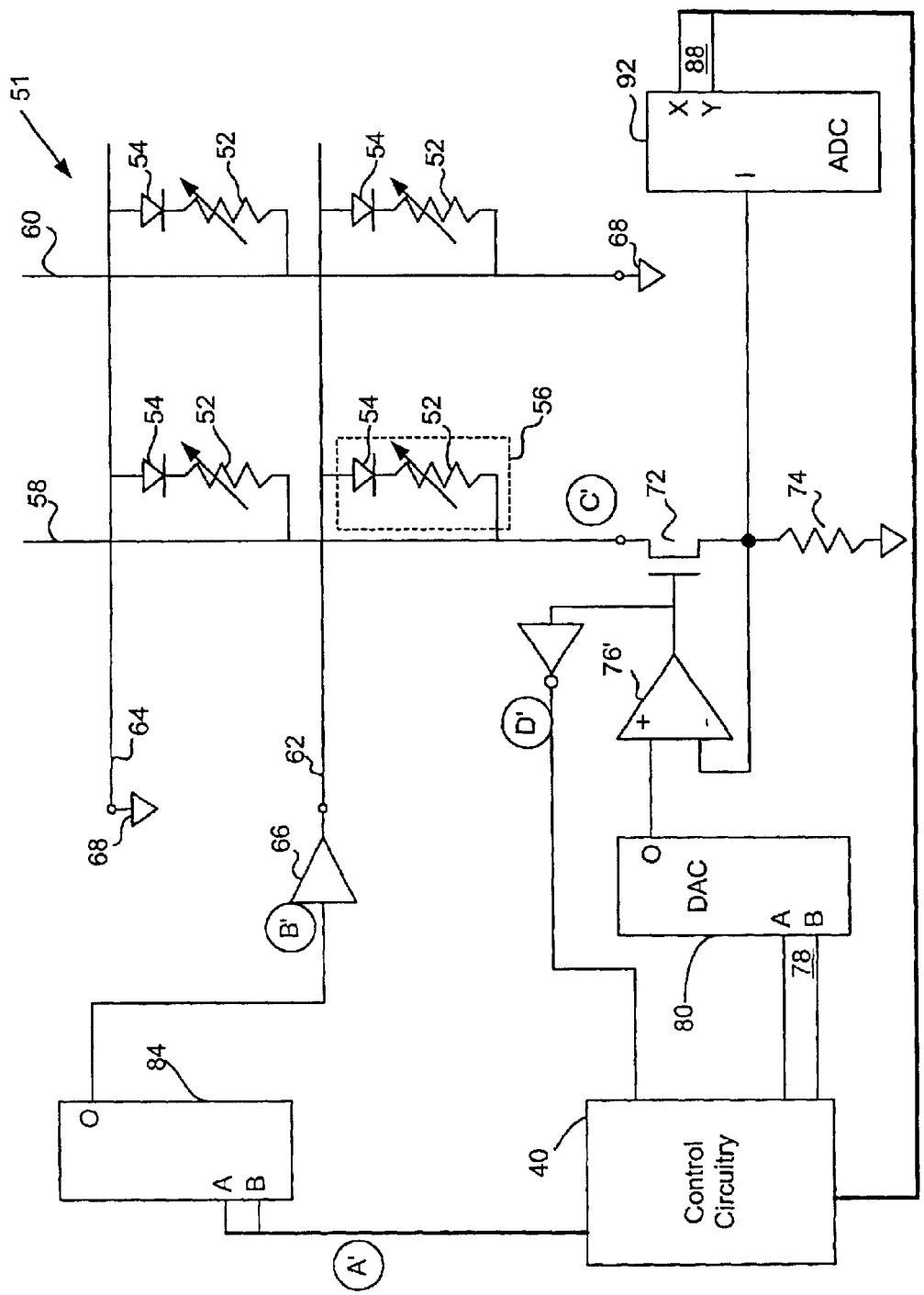
FIG. 6 is an exemplary schematic of a second embodiment of the invention.

FIG. 6 is an alternative embodiment 51 of the invention in the form of a simplified schematic that leaves out detail of the row and column decoders. In this embodiment, the voltage source 84 is optionally a digital to analog (D/A) voltage source that is controlled by the control circuitry. In this embodiment, the state-change element 52 in the selected memory cell 56 is programmed using a digital pulse train from the control circuitry 40 to allow for interactive verification of desired state-change during programming. This method is feasible for many state-change devices that require a discrete amount of energy to be programmed. During the write operation, smaller discrete amounts of energy are used to partially program the state-change device and then the device is verified for success or failure of the desired state-change. When programming is successful, then the pulse train is terminated. Thus in this embodiment, the state-change device is verified as part of the programming write operation and the resulting digitized readback signal is used as feedback to digitally control the write operation. This approach allows for all of the control of the read and write operations to be digital except for the sense amp which can be a simple comparator circuit easily incorporated in a reduced complexity solution.

In this second embodiment 51, the control circuitry 40 generates Signal A'. Signal A' is a digital pulse train of one or more bits (shown as bits A and B) that selects the voltage applied by a voltage source digital to analog converter (DAC) 84 and buffer 66 to the selected memory cell 56. The control circuitry 40 also sends a digital code of one or more bits to the input 78 (shown as inputs A and B) of DAC 80 to select a voltage level (shown as output O) that is compared to the converted current (by sense resistor 74) seen through the selected state-change device 52. The converted voltage seen across sense resistor 74 is applied to the input (shown as input I) of a set of fixed comparators or preferably an analog to digital converter (ADC) 92. The outputs 88

(shown as outputs X and Y) of the ADC 92 are coupled to the control circuitry 40 for determining that the proper state has been reached during programming of the selected state-change device 52. Op-amp 76 is still used to enable and disable programming of the selected state-change device 52 by controlling the N-FET 72. Signal D' is shown as an inverted signal of op-amp 76 and is coupled to the control circuitry 40 so it can be monitored during the programming cycle. Signal C' is a representation of the current seen through the selected state-change device 52 during the programming process. Signal B' represents the output of the voltage source DAC 84.

Figure 7:
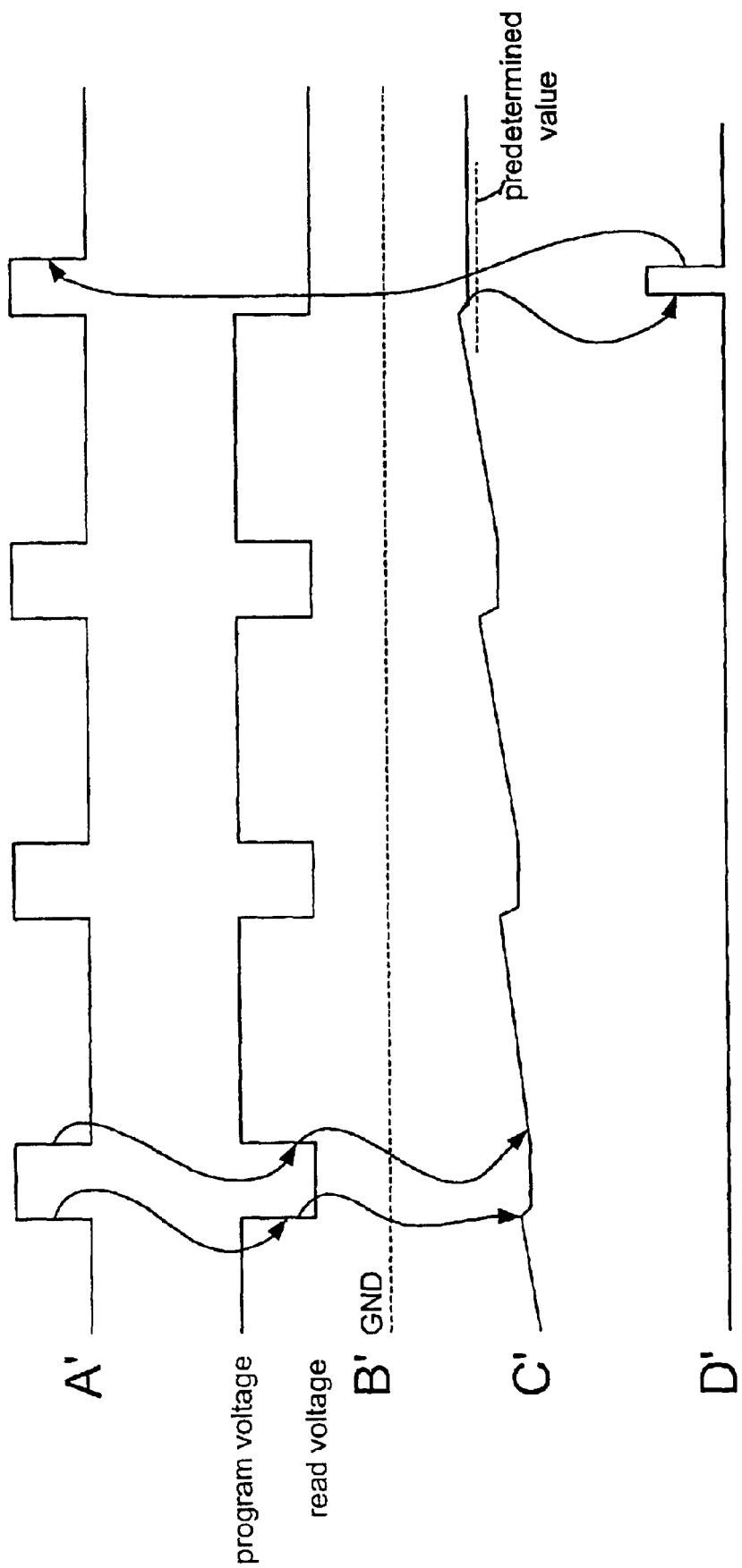
FIG. 7 is an exemplary timing diagram signals created by the second embodiment of the invention shown in FIG. 6.

FIG. 7 is an exemplary timing chart of a possible programming sequence used in the second embodiment 51 of the invention. The control circuitry 40 generates Signal A' to select between a first voltage, the program voltage, and a second voltage, the read voltage. Signal B' represents the voltage presented to the selected memory cell. Signal A' is shown here as an active high/low signal but may actually include one or more digital bits. When high, Signal A' causes the read voltage to be presented and when low, Signal A' causes the program voltage to be presented. Signal C' represents the current flowing through the selected state-change device 52 after it has been converted to a voltage by sense resistor 74. During the program portion of Signal A' the current through the state-change device 52 begins to rise as the resistance of the state-change device is lowered. During the read portion of Signal A', the voltage presented to the state-change device 52 is lowered and thus so is the current passing through it. Because the voltage presented is lowered to a value less than that necessary to continue programming, the current through the state-change device 52 stays constant during the read cycle after it stabilizes and this value is converted to a digital value by DAC 92 that is read by the control circuitry 40 to determine if the desired state has been reached. Signal D' represents the inverted output of op-amp 76 and is used to disable programming.

Figure 8:
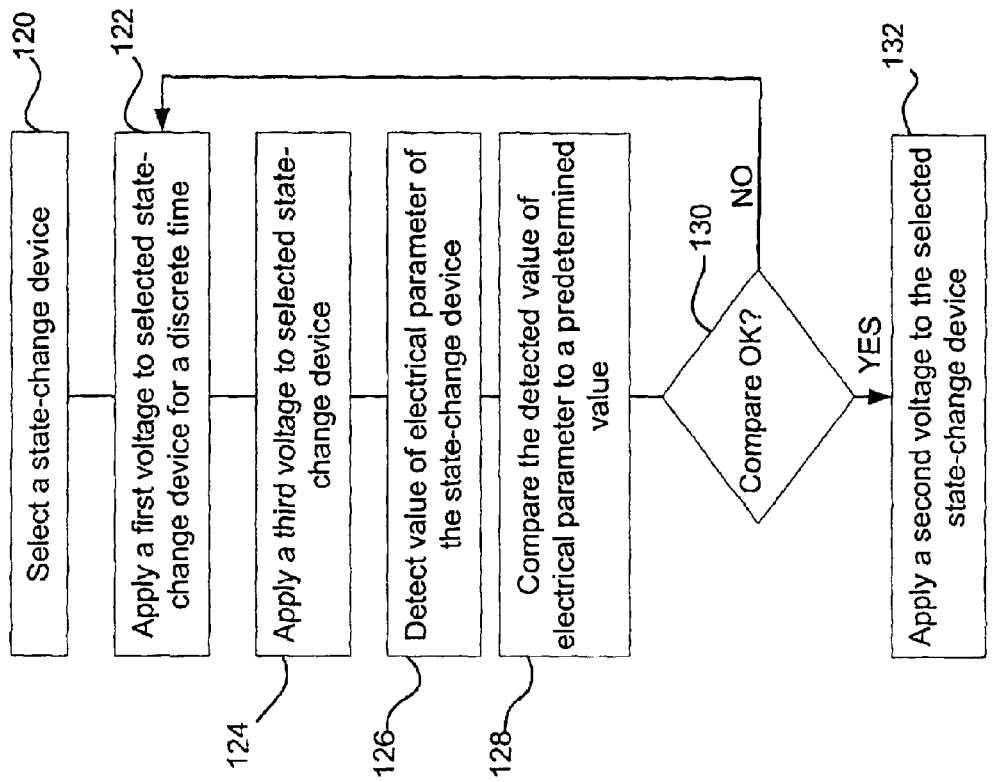
FIG. 8 is a flow chart of an exemplary process used to program a memory cell in the second embodiment of the invention.

FIG. 8 is an exemplary flow chart of the programming process used in the second embodiment 51. In step 120, the control circuitry selects a state-change device to be programmed. In step 122 a first voltage, the program voltage is applied to the selected state-change device for a discrete time. The discrete time is a portion of the time required to alter the state-change device to its fully programmed state. During this discrete time, if not already fully programmed, the current in the state-change device follows along the programming path 20 (see FIG. 1) for example to Iw1. In step 124, a third voltage such as the read voltage is applied to the selected state-change device and the current read to see if it has entered a desired state, such as Ir2 in this example. In step 126 the value of an electrical parameter of the state-change device, preferably the current but alternately the resistance, conductance, voltage, capacitance, inductance, or impedance is detected. In step 128, the detected value of the electrical parameter is compared to a predetermined value in the control circuitry 40, such a verifying that Ir2, within appropriate limits, has been reached. In step 130 the results of the comparison causes the programming to take different paths. If the desired state has been reached then in step 132 a second voltage, preferably the read voltage but alternatively a virtual ground or other voltage lower than the programming voltage is applied to the selected state-change device. If the desired state has not been reached, then the steps of applying a first voltage, applying a third voltage, detecting the value of an electrical parameter and comparing the detected value are repeated until the proper state is reached.

It should be noted that it would be obvious to those skilled in the art that many variations and modifications may be made to the disclosed embodiments without substantially departing from the invention. All such variations and modifications are intended to be included herein within the scope of the present invention, as set forth in the following claims.

What is claimed is:

1. An integrated circuit, comprising:
   an array of state-change devices and including a first decoder circuit and a second decoder circuit for selecting a particular state-change device;
   a voltage source coupled to the first decoder circuit;
   sense circuitry coupled to the second decoder receiving an electrical parameter from the selected state-change device and detecting a particular value of the electrical parameter; and
   a control circuit coupled to the voltage source, the first and second decoders, and the sense circuitry for selecting a first voltage from the voltage source to alter the selected state-change device and for selecting a second voltage from the voltage source when the sense circuitry detects the particular value of the electrical parameter.

2. The integrated circuit of claim 1, wherein the control circuit includes logic for selecting the first voltage for a predetermined time and then selecting a third voltage before the sense circuitry detects the particular value of the electrical parameter.

3. The integrated circuit of claim 2 wherein the third voltage is equal to the second voltage.

4. The integrated circuit of claim 2, wherein the control circuit includes logic for repeatedly selecting the first voltage for a predetermined time and then selecting the third voltage until the sense circuitry detects the particular value of the electrical parameter.

5. The integrated circuit of claim 1, wherein the control circuit creates a digital pulse train to alternately select between applying the first voltage and a third voltage to the state-change device until the sense circuitry detects the particular value of the electrical parameter.

6. The integrated circuit of claim 5, wherein the sense circuitry compares the received electrical parameter to the particular value during the time the third voltage is applied to the state-change device.

7. The integrated circuit of claim 1 wherein the state-change device is selected from the group consisting of direct tunneling antifuses, silicide switches, and Lecomber switches.

8. The integrated circuit of claim 1 wherein the state-change device comprises read-writeable phase-change material.

9. The integrated circuit of claim 1 wherein the sense circuitry comprises an analog to digital converter for converting the detected electrical parameter to a digital value.

10. The integrated circuit of claim 1 wherein the sense circuitry comprises a digital to analog converter for converting the particular value to an analog signal that is compared to the received electrical parameter.

11. An integrated circuit, comprising:
    a state-change device in a first state and having an input, an output, and at least three possible states;
    a voltage source coupled to the input of the state-change device;
    a sense circuit coupled to the output of the state-change device for detecting when the state-change device enters a predetermined state of the three possible states; and control circuitry for selecting a first voltage of the voltage source to alter the state-change device and for selecting a second voltage of the voltage source when the sense circuit detects the predetermined state.

12. The integrated circuit of claim 11, further comprising:
a pulse circuit creating a digital pulse train in the control circuitry for alternatively selecting between the first voltage and a third voltage of the voltage source; and
wherein the sense circuit detects a change of state of the state-change device during the time the third voltage is applied.

13. The integrated circuit of claim 12 wherein the third voltage is equal to the second voltage.

14. The integrated circuit of claim 12, wherein the control circuit includes logic for repeatedly selecting the first voltage for a predetermined time and then selecting the third voltage until the sense circuitry detects the particular value of the electrical parameter.

15. The integrated circuit of claim 11, wherein the control circuit creates a digital pulse train to alternately select between applying the first voltage and a third voltage to the state-change device until the sense circuitry detects the particular value of the electrical parameter.

16. The integrated circuit of claim 15, wherein the sense circuitry compares the received electrical parameter to the particular value during the time the third voltage is applied to the state-change device.

17. The integrated circuit of claim 11 wherein the state-change device is selected from the group consisting of direct tunneling antifuses, silicide switches, and Lecomber switches.

18. The integrated circuit of claim 11 wherein the state-change device comprises read-writeable phase-change material.

19. The integrated circuit of claim 11 wherein the sense circuitry comprises an analog to digital converter for converting the detected electrical parameter to a digital value.

20. The integrated circuit of claim 11 wherein the sense circuitry comprises a digital to analog converter for converting the particular value to an analog signal that is compared to the received electrical parameter.

21. A device having memory array, comprising:
a state change device;
means for applying a first voltage to the state-change device;
means for detecting an electrical parameter of the state-change device;
means for comparing the detected electrical parameter to a particular value; and
means for applying a second voltage to the state-change device when the detected electrical parameter compares with the particular value.

22. The device of claim 21 wherein the mean for applying a first voltage is performed in discrete time frames by alternately providing the first voltage and a third voltage.

23. The device of claim 22 wherein the third voltage is equal to the second voltage.

24. The device of claim 22, wherein the means for applying a first voltage includes means for repeatedly selecting the first voltage for a predetermined time and then selecting the third voltage until the means for detecting detects the particular value of the electrical parameter.

25. The device of claim 21 wherein the state-change device is selected from the group consisting of direct tunneling antifuses, silicide switches, and Lecomber switches.

26. The device of claim 21 wherein the state-change device comprises read-writeable phase-change material.

27. The device of claim 21 wherein the means for detecting comprises an analog to digital means for converting the detected electrical parameter to a digital value.

28. The device of claim 21 wherein the means for comparing comprises a digital to analog means for converting the particular value to an analog signal that is compared to a received electrical parameter.

29. The device of claim 21, wherein the means for applying a first voltage creates a digital pulse train to alternately select between applying the first voltage and a third voltage to the state-change device until the sense circuitry detects the particular value of the electrical parameter.

30. The device of claim 29, wherein the means for comparing compares a received electrical parameter to the particular value during time the third voltage is applied to the state-change device.

31. A method of programming a memory array, comprising the steps of:
selecting a state-change element from an array of state-change elements;
applying a first voltage to the selected state-change element;
detecting an electrical parameter of the selected state-change element;
comparing the detected electrical parameter to a predetermined value; and
applying a second voltage to the selected state-change element when the detected electrical parameter compares to the predetermined value.

32. The method of claim 31 further comprising the step of verifying that the state-change device has been programmed to a proper state.

33. The method of claim 31, wherein the step of applying a first voltage further comprises applying the first voltage for a discrete time period and further comprising the steps of:
applying a third voltage to the selected state-change element after the discrete time period before detecting the electrical parameter through the selected state-change element; and
if the detected electrical parameter does not compare to the predetermined value, repeating the steps of applying a first voltage, applying a third voltage, detecting the electrical parameter, and comparing the detected electrical parameter.

* * * * *

UNITED STATES PATENT AND TRADEMARK OFFICE
CERTIFICATE OF CORRECTION

PATENT NO.   : 6,879,525 B2
DATED        : April 12, 2005
INVENTOR(S)  : Van Brocklin et al.

It is certified that error appears in the above-identified patent and that said Letters Patent is hereby corrected as shown below:

Column 7,
Line 2, delete "0)" and insert therefor -- O) --.

Signed and Sealed this

Thirteenth Day of December, 2005

JON W. DUDAS
*Director of the United States Patent and Trademark Office*